United States Patent [19]

Aiken, deceased et al.

[11] 3,934,236

[45] Jan. 20, 1976

[54] PULSED FIELD ACCESSED BUBBLE PROPAGATION CIRCUITS

[75] Inventors: Howard H. Aiken, deceased, late of Ft. Lauderdale, Fla., by Mary E. Aiken, executrix; Paul T. Bailey, Creve Coeur, Mo.; Robert C. Minnick, Houston, Tex.

[73] Assignee: Monsanto Company, St. Louis, Mo.

[22] Filed: Jan. 11, 1974

[21] Appl. No.: 432,437

[52] U.S. Cl. .................... 340/174 TF; 340/174 SR
[51] Int. Cl.² ................. G11C 11/14; G11C 19/08
[58] Field of Search ................. 340/174 TF, 174 SR

[56] References Cited
UNITED STATES PATENTS

| | | | |
|---|---|---|---|
| 3,723,716 | 3/1973 | Bobeck et al. | 340/174 TF |
| 3,815,107 | 6/1974 | Almasi | 340/174 TF |

OTHER PUBLICATIONS

IBM Tech. Disc. Bull. "Bubble Domain Logic Circuits" by Lin, Vol. 13, No. 10, 3/71 pp. 3019–3020.
IBM Tech. Disc. Bull. "Herringbone Pattern for Cylindrical Magnetic Domains" by Keefe et al., Vol. 13, No. 11, 4/71 pp. 3307, 3308.

*Primary Examiner*—Stanley M. Urynowicz, Jr.
*Attorney, Agent, or Firm*—Lane, Aitken, Dunner & Ziems

[57] ABSTRACT

Overlay patterns of discrete circuit elements for field-accessed, magnetic bubble propagation are driven by repetitive sequences of pulsed magnetic fields directed along axes which are parallel to consecutive overlay elements or segments with different orientations. A chevron circuit is driven by a series of reversing pairs of pulsed fields aligned alternately with the legs of the chevron elements. Two opposite parallel chevron circuits are driven in the same direction by the same sequence of pulsed fields. A broken element circuit, resembling a chevron circuit with the vertices removed, is driven in a similar manner.

15 Claims, 4 Drawing Figures

PULSED FIELD ACCESSED BUBBLE PROPAGATION CIRCUITS

BACKGROUND OF THE INVENTION

The invention relates generally to the field of magnetic bubble technology (MBT) and, more particularly, to means for propagating or transmitting magnetic bubbles.

Briefly, MBT involves the creation and propagation of magnetic bubbles in specially prepared magnetic materials. The word "bubble" used throughout this text is intended to encompass any single-walled magnetic domain, defined as a domain having an outer boundary which cloes on itself. The application of a static, uniform magnetic bias field orthogonal to a sheet of magnetic material having suitable uniaxial anisotropy causes the normally random, serpentine pattern of magnetic domains to shrink into short cylindrical configurations or bubbles whose common polarity is opposite that of the bias field. The bubbles repel each other and can be moved or propagated by a magnetic field in the plane of the sheet.

Many schemes now exist for propagating bubbles along predetermined channels. One system includes permalloy circuit elements shaped like military service stripes or "chevrons" spaced end-to-end in a thin layer over the sheet of magnetic material. The drive field is caused to rotate continuously in the plane of the sheet, for example, by using a Helmholtz coil arrangement, making each chevron act as a small magnet with changing poles. As the drive field rotates, a bubble under one of the chevrons is moved along the chevron channel from point-to-point in accordance with its magnetic attraction to the nearest attracting temporary pole among the circuit elements. This system is among those referred to as "field-accessed," as distinguished from other systems employing sequentially pulsed loops of electrical conductors disposed in series over the magnetic sheet.

MBT can be used in data processing because magnetic bubbles can be propagated through channels at a precisely determined rate so that uniform data streams of bubbles are possible in which the presence or absence of a bubble indicates a binary "1" or "0."

Because of the difficulties in implementing continuous patterns of conductor overlays, field-accessed circuits have in general been considered potentially superior to conductor-accessed circuits. Uniformly rotating magnetic drive fields have been used in most field-accessed circuit arrangements. Some field-accessed circuits using a nonrotating magnetic drive field are shown in U.S. Pat. No. 3,543,252 to Perneski. Variations on the familiar T-bar circuit are described, driven by various permutations of orthogonal fields. U.S. Pat. No. 3,518,643 to Perneski illustrates a continuous zigzag pattern overlay arrangement driven by an in-plane, reorienting drive field repeatedly switched over an arc of 90°.

SUMMARY OF THE INVENTION

One of the objects of the invention is to propagate bubbles in field-accessed circuits by means of pulsed fields which are directed along axes separated by less than 90°. Another object of the invention is to simplify the structure of circuit elements in field-accessed propagation systems. A further object of the invention is to operate a circuit normally driven by a uniformly rotating drive field by means of a nonrotating sequence of pulsed field directions applied in an order unlike the order in which they would occur as components of a rotating field. Still another object of the invention is to generate certain sequences of pulsed drive fields which can be used to drive two circuits which would propagate bubbles in opposite directions in a rotating field, such that they always propagate simultaneously in the same direction.

It has been discovered that these and other objects of the invention are achieved by driving certain overlay patterns of discrete circuit elements with repetitive sequences of non-rotating pulsed magnetic fields directed along axes which are parallel to consecutive overlay elements or segments with different orientations. The pulsed fields are aligned with consecutive straight elements of the circuit overlay such that the in-plane drive field aligns itself first in one and then the other direction parallel to a first straight element. The pulsed fields are next aligned in first one and then the other direction parallel to the second straight element. In this manner a bubble under the overlay circuit is caused to move to attracting poles at successive ends of consecutive with different orientations.

In one embodiment this propagation system is applied to a chevron circuit. It is demonstrated that two opposite chevron circuits, arranged for parallel propagation, both propagate in the same direction using the reversing pair pulsed field technique while the same circuits under the control of a rotating drive field would propagate in opposite directions.

A novel form of circuit overlay pattern, resembling chevrons with their vertices removed, also propagates with the reversing pair, pulsed field technique while propagation with this circuit would not occur in a rotating drive field.

DESCRIPTION OF THE PREFERRED EMBODIMENTS

Figure 1:
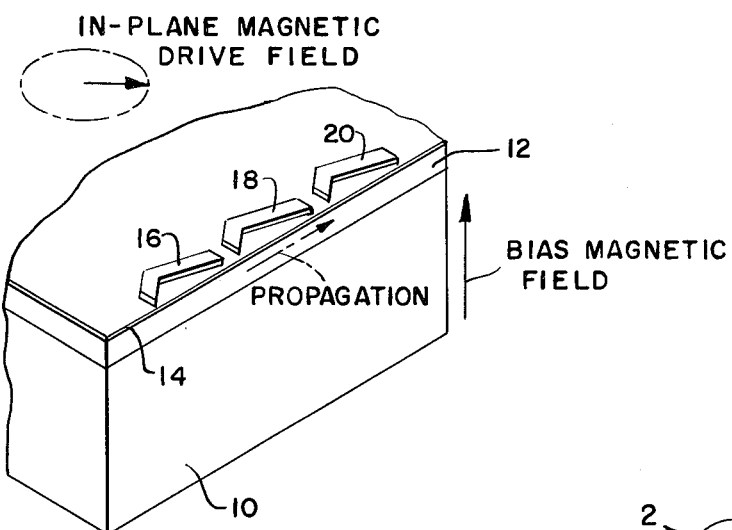
FIG. 1 is a fragmentary perspective view of a bubble chip furnished with a conventional chevron circuit.

FIG. 1 illustrates the basic components of a conventional field-accessed garnet bubble chip with discrete chevron bubble circuit elements in the form of a permalloy overlay. A substrate 10 of nonmagnetic garnet supports an epitaxial magnetic bubble garnet layer 12 and a spacing layer 14 of silicon oxide to which conventional permalloy chevron circuit elements 16, 18 and 20 are bonded end-to-end. The chip is subjected to a magnetic bias field orthogonal to the plane of the magnetic bubble garnet layer 12. In the presence of a bias field of suitable strength, cylindrical bubbles (not shown in FIG. 1) are maintained in bubble garnet layer 12. A rotating, inplane magnetic drive field causes bubbles to propagate from element to element. The path formed by chevrons 16, 18 and 20 is termed a channel, and while the lateral width of the channel shown in FIG. 1 constitutes a single chevron element, it is well known that the greater the number of elements per bubble position, the better the performance. Other parameters for optimizing performance include the angle of the chevron, the horizontal and vertical spacing of packed chevrons and the width of each individual element. It is also well known that the propagation performance depends on the bias and drive field strengths and the rate of propagation among other parameters. The conventional operation of chevron circuits was first described in "An Overview of Magnetic Bubble Domains—Material Device Interface," A. H. Bobeck et al, AIP Conf. Proc. No. 5, pp. 45–55, 1971.

Figure 2:
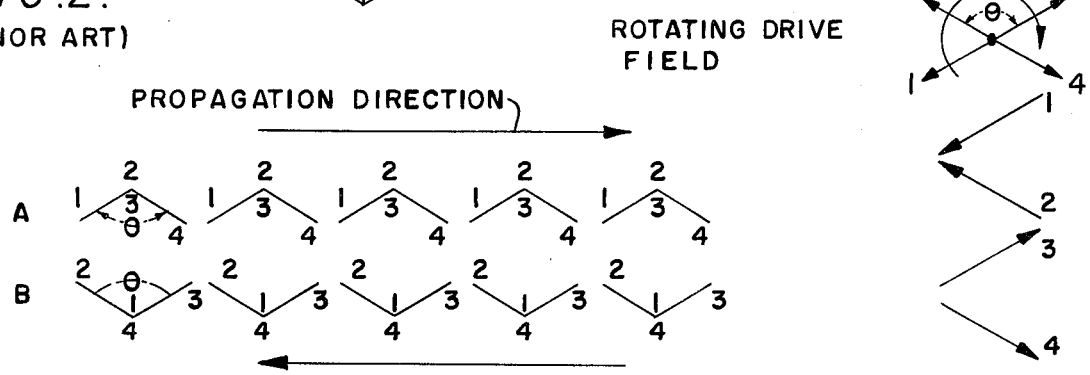
FIG. 2 is a schematic diagram illustrating a pair of opposite chevron circuits operated in the conventional manner.

In FIG. 2 a pair of conventional chevron circuits A and B are arranged for parallel propagation in opposite directions by reversing the direction of the vertex of each chevron in channel B in relation to the chevrons in channel A. Thus, channel B is upside down with respect to channel A. For convenience, channels A and B are referred to as "opposite" propagation channels.

Channel A propagates to the right as viewed in FIG. 2 under the control of an in-plane clockwise rotating drive field, produced, for example by a pair of orthogonal Helmholtz coils driven 180° out of phase by alternating currents of the same magnitude. All of the chevron elements in channels A and B are characterized by the angle $\theta$ which is typically about 120°.

As the rotating drive field in FIG. 2 sweeps continuously through 360° during each cycle, it aligns itself alternately with the legs of the chevron elements. The aligned orientations are indicated by the numerals 1, 2, 3 and 4 designating consecutive directions of the rotating field vector. Thus directions 1 and 3 are aligned with the lefthand legs of the chevrons in channel A, and directions 2 and 4 aligned with the righthand legs. Consecutive bubble positions corresponding to these field directions are indicated in channels A and B by numerals 1, 2, 3 and 4. Positions 2 and 3 in channel A and 1 and 4 in channel B are the same. In channel A, the first field direction produces an attracting pole at the lefthand ends of the chevron elements. The second and third field orientations cause bubbles to be attracted to the vertex of each chevron element; and the fourth field direction produces attracting poles at the righthand ends of the elements. Similarly, for channel B, the third field direction produces attracting poles at the righthand ends; consecutive fields 4 and 1 attract bubbles to the vertices, and field direction 2 produces attracting poles at the lefthand ends of the chevron elements. In a rotating drive field, channel B always propagates in the opposite direction from channel A. Counterclockwise rotation of the drive field would reverse the propagation directions in both channels A and B.

Figure 3:
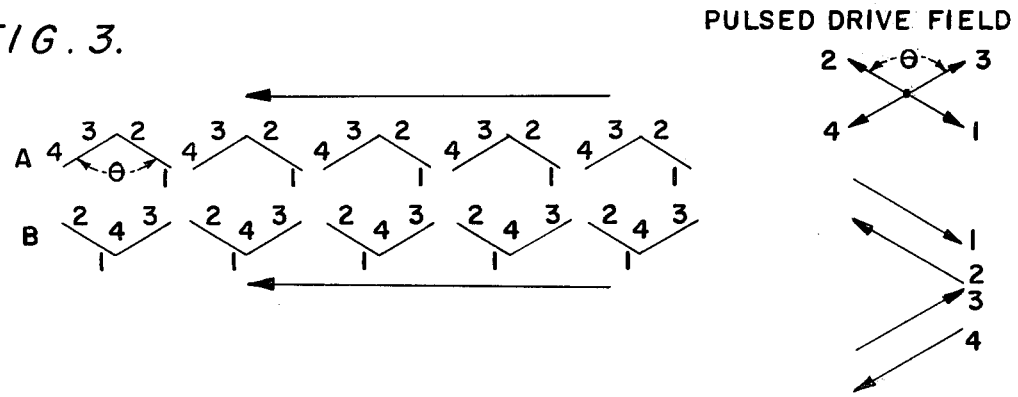
FIG. 3 is a schematic diagram illustrating a pair of opposite chevron circuits driven monotonically according to the invention.

FIG. 3 illustrates a similar pair of opposite chevron channels A and B driven by a pulsed drive field according to the invention. In this arrangement the drive field is not comparable to a rotating field because the sequence of field directions does not correspond to any of the consecutive orientations which a rotating field would undergo. The field directions, illustrated schematically to the right of channels A and B, follow the principle of reversing pairs of field directions, aligned with consecutive legs of the circuit elements. Thus, field position 1 in FIG. 3, arbitrarily chosen as the first direction in each repetitive sequence of four field directions, points in one direction parallel to the right-hand leg of each chevron element in channel A. Thus as attracting pole, designated by the numeral 1, will be formed at the right-hand end of each circuit element in channel A. To progress to the next bubble position, the field is reversed 180° so that it is still parallel with the right-hand leg of each circuit element in channel A but points in the opposite direction thus forming an attracting pole at the vertex of each element and a repulsive pole at the right-hand end of each element in channel A. For the third bubble position, the field is pulsed in a different direction aligned with the left-hand leg of each chevron element, thus about 120° from the second field orientation. An attracting pole is again formed at the vertex of each chevron element for bubble position three. Actually bubble position three may effect only a slight displacement of the bubble across the vertex of the chevron. Bubble position 4 is obtained by reversing the field direction 3 by 180° so that the field direction 4 is still aligned with the left-hand leg of each chevron but points in the opposite direction, thus forming an attracting pole at the left-hand end of each element.

Channel B in FIG. 3 operates in an equivalent manner, with the exception that the first two field directions are aligned with the left-hand leg of each circuit element and the third and fourth field positions are aligned with the right-hand leg. The direction of propagation remains the same for channel B.

Pulsed fields in the directions illustrated in FIG. 3 can be obtained by a sequence of pulses of appropriate polarity and varying magnitude applied to a suitably oriented pair of Helmholtz coils.

Figure 4:
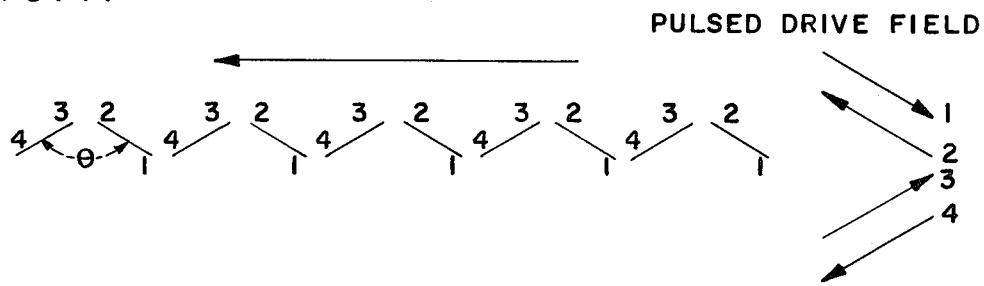
FIG. 4 is a schematic diagram illustrating a broken element circuit according to the invention.

FIG. 4 illustrates an unconventional type of circuit element, termed a "broken element" circuit, which resembles either one of the chevron channels A and B with the vertices removed. The reversing pair drive field sequence illustrated in FIG. 3 propagates bubbles in the broken element circuit of FIG. 4 in the same direction as in FIG. 3.

One of the important features of the invention is that the pulsed fields are always aligned with one of the dipole, straight leg elements of the overlay pattern. Power is not wasted on ineffective orientations of the field as it is in conventional rotating drive fields. Other important features of the invention are that the pulsed fields are nonrotating and that an overlay pattern of discrete noncontinuous circuit elements, in which consecutive straight segments or elements are aligned with different axes (i.e., nonparallel), is driven by a repetitive sequence of pulsed drive fields parallel to said axes. In the embodiments described herein the axes are separated by less than 90° and the pulsed fields occur in reversing pairs aligned with consecutive reorienting segments or elements of simple circuit overlay patterns. Another important feature is that chevron circuits which normally propagate in opposite directions can be driven so as to only propagate in one direction.

The invention may be embodied in other specific forms without departing from its spirit or central characteristics. The present embodiments are therefore to be considered in all respects as illustrative and not restrictive, the scope of the invention being indicated by the claims rather than by the foregoing description; and all changes that come within the meaning and range of equivalence of the claims are therefore intended to be embraced therein.

We claim:

1. A magnetic bubble propagation system, comprising a field-accessed bubble overlay pattern and means for generating a repetitive sequence of reversing pairs of pulsed field orientations realigning consecutively with mutually oblique axes parallel to the plane of said overlay pattern.

2. The system of claim 1, wherein said overlay pattern consists of discrete ferromagnetic circuit elements composed of straight segments, and said drive field axes are aligned respectively with said segments.

3. A magnetic bubble propagation system, comprising a field-accessed magnetic bubble overlay pattern consisting of discrete ferromagnetic circuit elements composed of straight segments, and means for generating pulsed magnetic drive fields in the plane of said overlay pattern directed along axes separated by less than 90° in a sequence determined such that consecutive orientations correspond to opposite directions along said axes respectively, said drive field axes being aligned respectively with said segments.

4. The system of claim 3, wherein said overlay pattern includes chevron circuit elements and said drive field axes are aligned respectively with the legs of said chevron circuit elements.

5. The system of claim 3, wherein said overlay pattern includes straight circuit elements spaced from each other end-to-end in consecutive angled pairs, and said drive field axes are aligned respectively with said straight elements.

6. A magnetic bubble propagation arrangement, comprising two opposite chevron circuit element channels for propagating magnetic bubbles in response to an in-plane magnetic drive field, and means for generating a repeating sequence of pulsed, in-plane magnetic drive fields directed along a pair of axes aligned respectively with the legs of said chevron circuit elements, consecutive orientations of said pulsed drive field being in opposite directions alternately along one and the other of said axes, whereby bubbles are propagated along said opposite channels in the same direction.

7. A magnetic bubble propagation system, comprising a field-accessed bubble propagation channel for propagating magnetic bubbles including a plurality of serially arranged straight ferromagnetic circuit elements laid end-to-end and serially designated for reference by consecutive integers, odd numbered elements being parallel and having a first orientation, even numbered elements being parallel and having a second orientation, and means for generating a predetermined sequence of pulsed magnetic drive fields in the plane of said channel consecutively reorienting in opposite directions alternately parallel to said first orientation and to said second orientation for propagating bubbles along said channel.

8. The system of claim 7, wherein said bubble propagation channel is not operable by any uniformly rotating magnetic drive field.

9. A magnetic bubble propagation system, comprising a sheet of magnetic bubble material, means for generating a magnetic bias field orthogonal to said sheet to produce and maintain bubbles therein, a field-accessed magnetic bubble overlay pattern on said sheet for propagating bubbles including consecutive ferromagnetic segments aligned along different axes, and means for generating a repetitive sequence of reversing pairs of magnetic drive fields parallel to said sheet and realigning consecutively with said axes to propagate bubbles from segment to segment.

10. A magnetic bubble propagation system, comprising a sheet of magnetic bubble material, means for generating a magnetic bias field orthogonal to said sheet to produce and maintain bubbles therein, a field-accessed propagation channel including a plurality of discrete ferromagnetic overlay bar-shaped elements serially arranged end-to-end on said sheet, consecutive ones of said elements being aligned along different axes, and means for generating a reorienting magnetic drive field parallel to said sheet for causing bubbles to traverse the length of each said element and for propagating bubbles from element of element along said channel.

11. The system of claim 10, wherein said drive field generating means produces a repetitive sequence of pulsed field orientations aligned with said axes.

12. The system of claim 10, wherein said elements are serially designated by consecutive integers, odd numbered elements being parallel to one axis, even numbered elements being parallel to another axis.

13. A magnetic bubble propagation system, comprising a sheet of magnetic bubble material, means for generating a magnetic bias field orthogonal to said sheet to produce and maintain bubbles therein, a field-accessed propagation channel including a plurality of discrete ferromagnetic overlay elements serially arranged end-to-end on said sheet such that bubbles traverse the length of each said element, said elements being serially designated by consecutive integers, odd numbered elements being parallel to one axis, even numbered elements being parallel to another axis, and means for generating a repetitive sequence of reversing pairs of pulsed magnetic drive field orientations parallel to said sheet and realigning consecutively with said axes for propagating bubbles from element to element along said channel.

14. The system of claim 13 wherein said axes are oblique.

15. A magnetic bubble propagation system, comprising two opposite chevron circuit element channels for propagating magnetic bubbles in response to an in-plane magnetic drive field, and means for generating a repeating sequence of pulsed in-plane magnetic drive fields such that bubbles are propagated along said opposite channels simultaneously in the same direction with the same sequence of drive fields.

* * * * *